(12) United States Patent
Vanderaa

(10) Patent No.: US 9,329,061 B2
(45) Date of Patent: May 3, 2016

(54) REDUCED-STRESS COUPLING FOR INDUSTRIAL PROCESS TRANSMITTER HOUSING

(71) Applicant: Rosemount Inc., Chanhassen, MN (US)

(72) Inventor: Joel David Vanderaa, St. Paul, MN (US)

(73) Assignee: Rosemount Inc., Chanhassen, MN (US)

( * ) Notice: Subject to any disclaimer, the term of this patent is extended or adjusted under 35 U.S.C. 154(b) by 247 days.

(21) Appl. No.: 13/780,868

(22) Filed: Feb. 28, 2013

(65) Prior Publication Data

US 2014/0238126 A1 Aug. 28, 2014

(51) Int. Cl.
*G01D 11/24* (2006.01)
*G01D 11/30* (2006.01)

(52) U.S. Cl.
CPC .............. *G01D 11/24* (2013.01); *G01D 11/245* (2013.01)

(58) Field of Classification Search
CPC .............................. G01D 11/24; G01D 11/245
USPC ............... 73/431, 866.5; 248/309.1, 313, 315
See application file for complete search history.

(56) References Cited

U.S. PATENT DOCUMENTS

| | | | | |
|---|---|---|---|---|
| 2,391,235 A | * | 12/1945 | Hathorn | 24/278 |
| 4,903,484 A | * | 2/1990 | Yates et al. | 60/316 |
| 6,606,897 B1 | * | 8/2003 | Koyano et al. | 73/23.2 |
| 6,901,803 B2 | | 6/2005 | Fandrey | |
| 7,472,608 B2 | * | 1/2009 | Hedtke | 73/861.63 |
| 7,830,314 B2 | | 11/2010 | McGuire et al. | |
| 8,217,782 B2 | | 7/2012 | Nelson et al. | |
| 8,362,959 B2 | | 1/2013 | McGuire | |
| 2005/0172738 A1 | * | 8/2005 | Broden | 73/866.5 |
| 2011/0248133 A1 | * | 10/2011 | Sugiyama et al. | 248/222.14 |

* cited by examiner

*Primary Examiner* — Peter Macchiarolo
*Assistant Examiner* — Anthony W Megna Fuentes
(74) *Attorney, Agent, or Firm* — Kinney & Lange, P.A.

(57) ABSTRACT

An industrial process transmitter comprises a sensor module, a housing and a compression ring. A process sensor is located in the sensor module. The housing comprises an electronics compartment having an internal space in which transmitter electronics are located, and a sensor compartment having opening into which the sensor module is inserted. The compression ring is attached to the sensor module or the housing and is configured to arrest rotation of the housing with respect to the sensor module.

24 Claims, 10 Drawing Sheets

REDUCED-STRESS COUPLING FOR INDUSTRIAL PROCESS TRANSMITTER HOUSING

BACKGROUND

The present disclosure relates generally to industrial process control transmitters. More particularly, the present disclosure relates to housings that protect electronics and sensors used in the transmitters.

Process instruments are used to monitor process parameters, such as pressure, temperature, flow and level, of process fluids used in industrial processes. For example, process transmitters are typically employed in industrial manufacturing facilities at multiple locations to monitor a variety of process parameters along various production lines. Process transmitters include sensors that produce an electrical output in response to physical changes in the process parameter. For example, pressure transmitters include capacitive pressure sensors that produce an electrical output as a function of the pressure of a process fluid, such as water lines, chemical tanks or the like. Each process transmitter also includes transmitter electronics for receiving and processing the electrical output of the sensor so that the transmitter and process parameter can be monitored locally or remotely. Locally monitored transmitters include displays, such as LCD screens, that show the electrical output at the site of the process transmitter. Remotely monitored transmitters include electronics that transmit the electrical output over a control loop or network to a central monitoring location such as a control room. Configured as such, the process parameter can be regulated from the control room by including automated switches, valves, pumps and other similar components in the control loop.

In order to couple these electrical components with the process fluid, the components are contained in casings that can be mounted to a process fluid vessel, such as a storage tank or pipeline, with process wetted components such as flanges, manifolds, diaphragms or other transmitter mounting components. Typically, the casings comprise a module in which the sensor is mounted to interact with the process fluid, such as through a diaphragm system, and a housing in which the transmitter electronics are positioned. The housing includes a port for receiving the module and wiring from the sensor. Additionally, the housing includes an access opening for connecting the transmitter electronics to wires of a network. Alternatively, the access opening can be fitted with an antenna that allows the transmitter electronics to communicate over a wireless network. Recent advancements in technology have led to a decrease in the size of antennas, which has permitted placement of the antenna completely within the housing and rendered the access opening unnecessary. Housings are conventionally fabricated from metallic materials, which are not highly permeable to wireless signals. There is, therefore, a need for industrial process transmitter housings that are more compatible with wireless network technology.

SUMMARY

An industrial process transmitter comprises a sensor module, a housing and a compression ring. A sensor is located in the sensor module. The housing comprises an electronics compartment having an internal space in which transmitter electronics are located, and a sensor compartment having opening into which the sensor module is inserted. The compression ring is attached to the sensor module or the housing and is configured to arrest rotation of the housing with respect to the sensor module.

DETAILED DESCRIPTION

Figure 1:
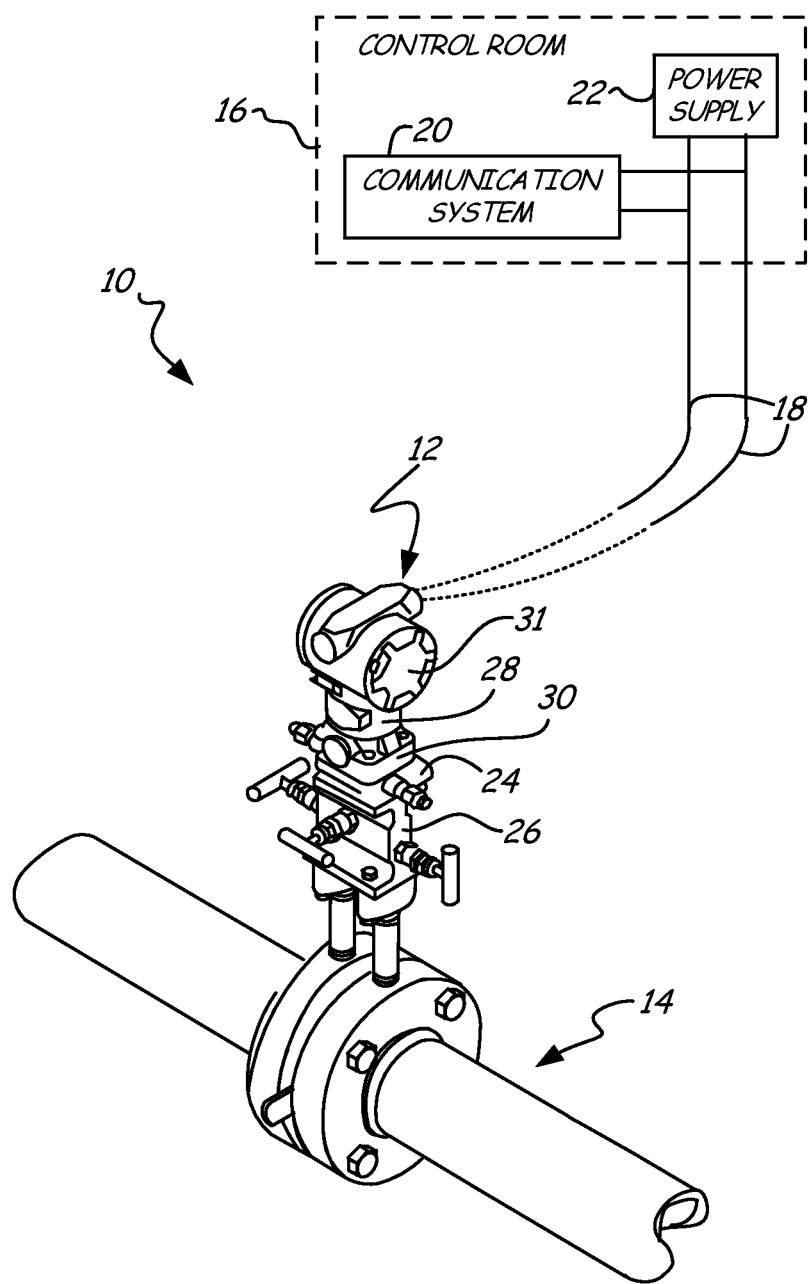
FIG. 1 is a schematic view of a process control system showing a pressure transmitter having a reduced-stress coupling of the present invention.

FIG. 1 shows process control system 10 in which process transmitter 12 of the present invention is used. Process control system 10 includes process transmitter 12, pipeline 14, control room 16 and control loop 18. Control room 16 includes communication system 20 and power supply 22. In this embodiment, process transmitter 12 is coupled with piping 14, in which a process fluid flows, through process flange 24 and manifold 26. Transmitter 12 includes transmitter housing 28, which includes transmitter circuitry, and sensor module 30, which includes a process sensor. The transmitter circuitry and process sensor generate an electrical signal based on a sensed pressure of the process fluid. Process transmitter 12 also includes other electrical components for transmitting the electrical signal over control loop 18 to control room 16, or a local display such as an LCD screen visible through cover 31, or both.

In one embodiment, process transmitter 12 is a two-wire transmitter for operating on a 4-20 mA loop. In such an embodiment, control loop 18 includes a pair of wires for supplying power to process transmitter 12 from power supply 22. Control loop 18 also enables control room 16 to transmit data to and receive data from process transmitter 12 utilizing communication system 20. Typically, a 4 mA DC current provides sufficient energy for operating the sensor and transmitter circuitry of process transmitter 12 and any local display. In other embodiments, process transmitter 12 communicates with control room 16 over a wireless network. Housing 28 is attached to module 30 via a reduced-stress coupling, as is discussed with reference to FIGS. 2-8.

Figure 2:
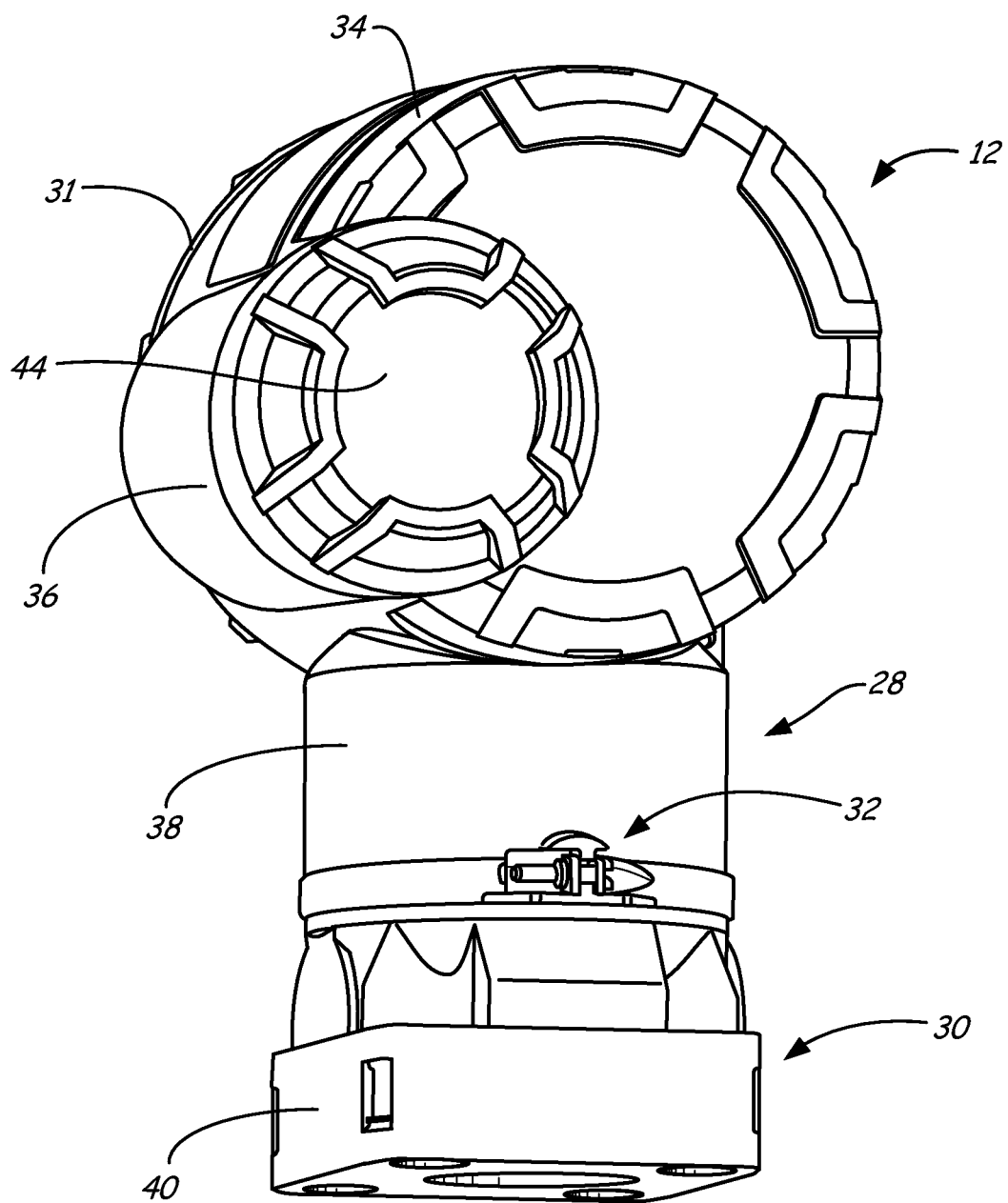
FIG. 2 is a perspective view of the transmitter of FIG. 1 showing an internal compression ring of the reduced-stress coupling joining an electronics housing to a sensor module.

FIG. 2 is a perspective view of transmitter 12 of FIG. 1 showing internal compression ring 32 of the reduced-stress coupling joining transmitter housing 28 to sensor module 30. Transmitter housing 28 of FIG. 2 is configured for use with battery-powered, wireless network electronics, rather than being configured for use with a wired network as shown in FIG. 1. Transmitter housing 28 includes electronics compartment 34, battery compartment 36 and module compartment 38. Sensor module 30 comprises a housing in which a sensor is incorporated to interface with a process fluid through a diaphragm positioned within flange 40. For example, sensor module 30 comprises a pressure sensor module as is described in U.S. Pat. No. 6,901,803 to Fandrey, which is assigned to Rosemount Inc., Eden Prairie, Minn. However, sensor module 30 may be configured to house other types of sensors, such as temperature, level and flow.

Figure 5:
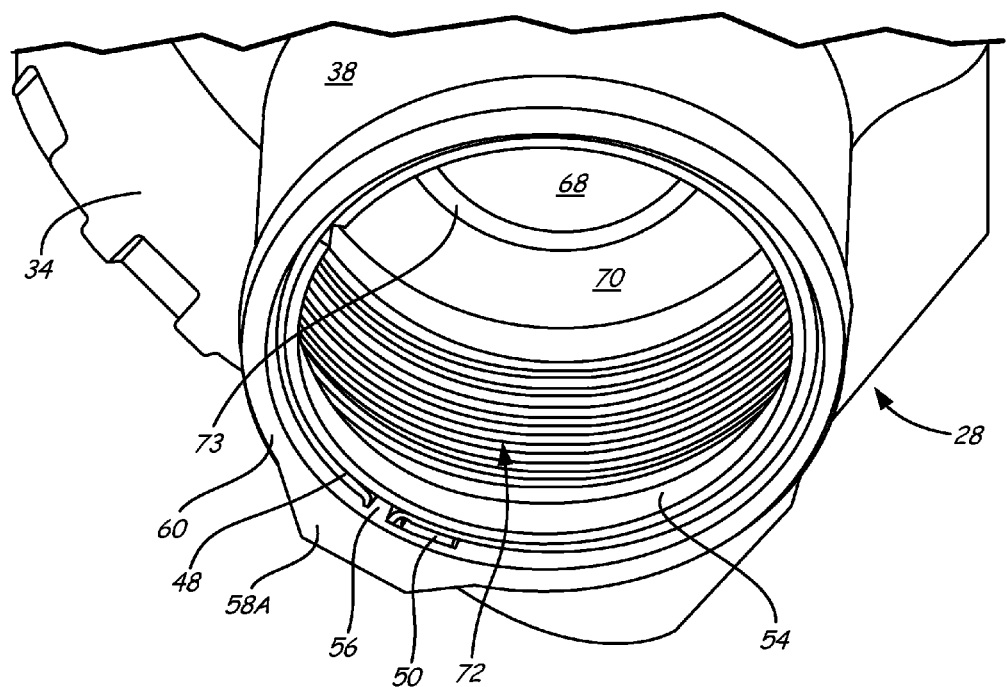
FIG. 5 is a bottom rear perspective view of the electronics housing of FIG. 2 with the sensor module removed to show the internal compression ring and spacer.

In the disclosed embodiment, electronics compartment 34 includes a cylindrical body in which electronics, such as signal processors and communication circuits, are located. For example, compartment 34 may include electronics as are described in U.S. Pat. No. 8,217,782 to Nelson et al., which is assigned to Rosemount Inc., Eden Prairie, Minn. Compartment 34 includes cover 31 that can be disengaged from compartment 34 to access electronics within internal space 68 (FIG. 5). Cover 31 typically comprises a circular plate threaded onto compartment 34. Likewise, battery compartment 36 includes cover 44 that can be disengaged from housing 28 to access a battery inside a storage space within compartment 36. Typically, the covers are threaded onto housing 28 with flame-proof engagements, as is known in the art. In one embodiment, housing 28 and its covers are fabricated from a polymeric material, such as polyethylene, polypropylene, polyvinylchloride and the like. In other embodiments, housing 28 and its covers are comprised of metallic materials, such as aluminum, steel, stainless steel and the like. In one embodiment of the invention, transmitter 12 includes electronics having a wireless antenna fully disposed within compartment 34, and housing 28 is made of a polymeric material permeable to wireless signals.

In typical embodiments, sensor module 30 includes a body that extends into module compartment 38 of housing 28. In the disclosed embodiment, module compartment 38 comprises a cylindrical body into which a mating cylindrical body (such as sensor housing 86 in FIG. 8) of sensor module 30 is threaded. The threaded engagement provides a coupling that secures housing 28 to module 30. In one embodiment, the threaded engagement can be configured as a flame-proof seal. The threaded engagement also allows housing 28 to be rotated into different positions on module 30. For example, module 30 is mounted to process piping in a fixed manner such that it is not adjustably positioned. Thus, it is desirable to reposition housing 28 with reference to module 30 to allow access to the covers of electronics compartment 34 and battery compartment 36, or to reposition an information display screen located on the housing. However, once housing 28 is positioned in a desirable location, it is beneficial to immobilize housing 28 with reference to module 30. Conventional process transmitters include a set screw that is threaded into the housing so as to be forced against the sensor module, thereby providing a tensile force between the two bodies that inhibits rotation. However, set screws have a tendency to strip out the threads in the housing, particularly if the housing is repeatedly overtightened. This drawback can be further exacerbated in embodiments where transmitter housing 28 is comprised of a plastic or polymer. Furthermore, stress induced in plastic or polymer from set screws produces a susceptibility to chemical attack or fatigue cracks. Metallic set screws coupled to metallic transmitter housings also produce the potential for galvanic corrosion. In the present invention, transmitter 12 is provided with compression ring 32 that provides a reduced-stress coupling between housing 28 and module 30 that immobilizes rotation of transmitter housing 28 on sensor module 30.

Figure 3A:
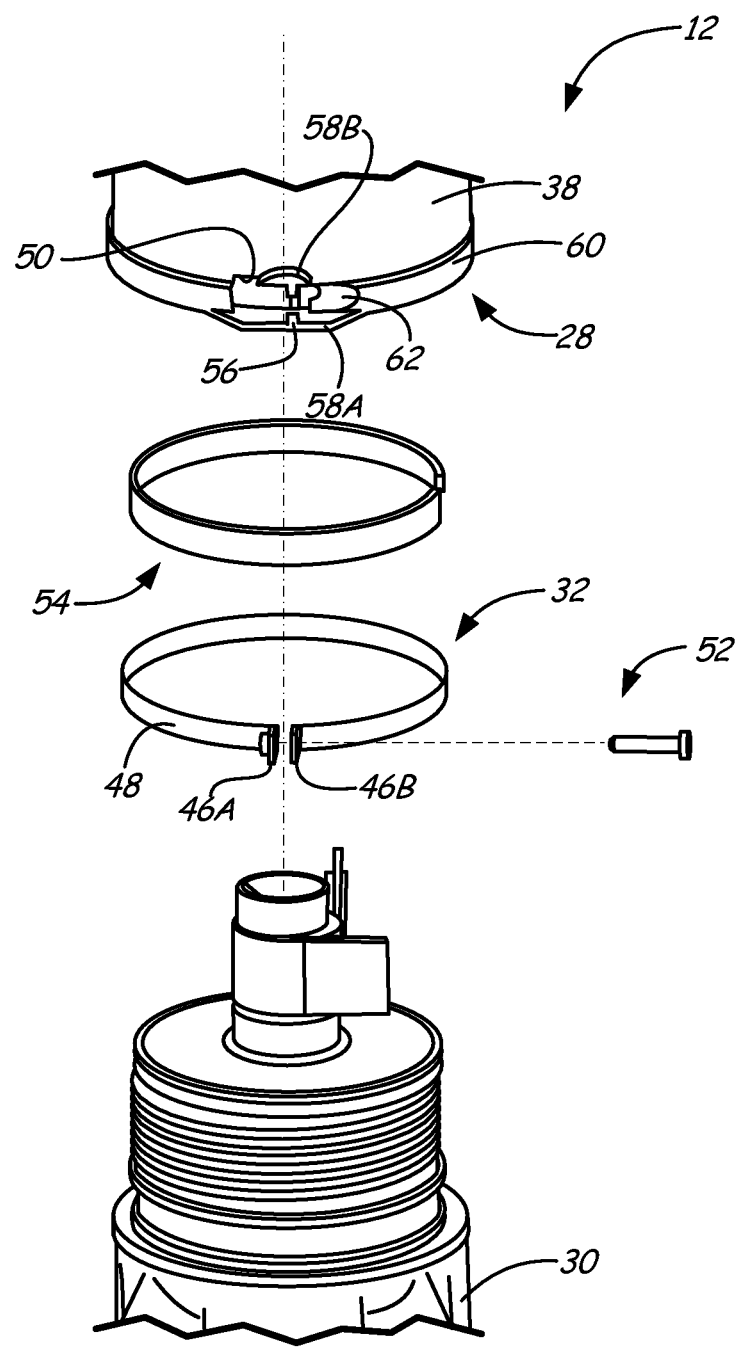
FIG. 3A is an exploded view of the transmitter of FIG. 2 showing a split band and a spacer hoop of the internal compression ring.
Figure 3B:
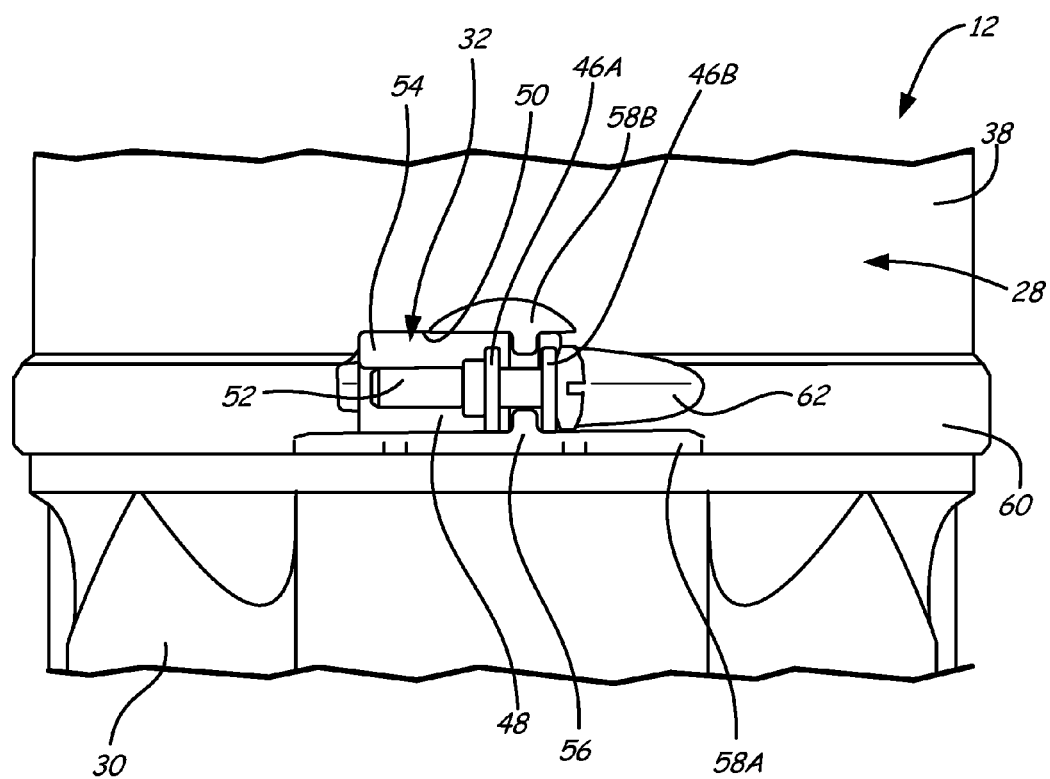
FIG. 3B is a close-up front view of the transmitter of FIG. 2 showing tabs of the internal compression ring extending through a window in the housing.

FIG. 3A is an exploded view of transmitter 12 of FIG. 2 showing split band 48 and spacer hoop 54 of internal compression ring 32. FIG. 3B is a close-up front view of transmitter 12 of FIG. 2 showing tabs 46A and 46B of compression ring 32 extending through window 50 in housing 28. The embodiment shown in FIGS. 3A and 3B are discussed concurrently. Tabs 46A and 46B extend from split band 48, which is joined with fastener 52 and spacer hoop 54. Housing 28 further preferably includes partition 56, shields 58A and 58B, rim 60 and indentation 62. Sensor module 30 is inserted into housing 28. In the embodiment described, module compartment 38 is formed of a cylindrical wall to define internal space 70 (FIG. 5) into which a cylindrical body of sensor housing 86 (FIG. 8) of sensor module 30 is inserted.

Spacer hoop 54 comprises a split ring that is fitted around sensor module 30. Split band 48 is positioned around spacer hoop 54 within housing 28. Housing 28 is fitted over split band 48 such that tabs 46A and 46B extend through window 50. Window or opening 50 includes partition 56 that extends between tabs 46A and 46B. Shields 58A and 58B extend from housing 28 alongside of window 50. Partition 56 extends across window 50 from shield 58A to shield 58B. Fastener 52 is inserted into bores within tabs 46A and 46B and passes through an opening in partition 56. Rim 60 circumscribes the edge of housing 28. Indentation 62 provides clearance for assembly of fastener 52 with tabs 46A and 46B.

Fastener 52 is threaded into tabs 46A and 46B to tighten split band 48 around spacer hoop 54 and sensor module 30. Split band 48 thus applies a compressive force around spacer hoop 54 and sensor module 30 to immobilize relative movement between those bodies and split band 48. Tabs 46A and 46B extend through window 50 to provide a fixed locator for arresting movement of housing 28. Furthermore, tabs 46A and 46B apply a compressive force to partition 56 to thereby also immobilize rotation of housing 28 with respect to sensor module 30. Partition 56 thereby comprises an anti-rotation feature that fixes the position of housing 28. The compressive loading of compression ring 32 is distributed around sensor module 30 to eliminate exposure of module compartment 38 to stress concentrations, such as those caused by the use of set screws and the like.

Figure 4:
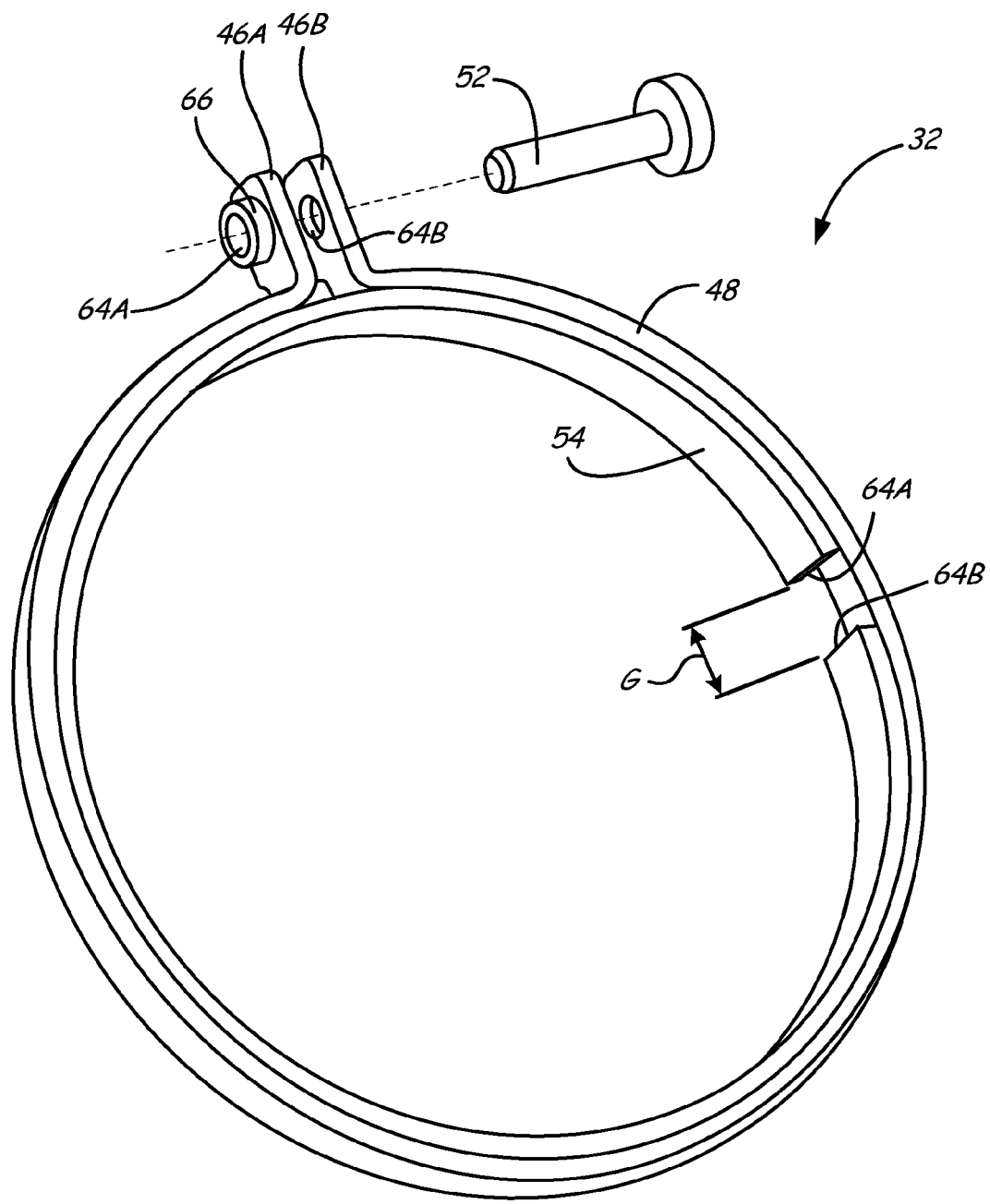
FIG. 4 is a perspective view of the internal compression ring of FIG. 3 including a fastener and a spacer.

FIG. 4 is a perspective view of one embodiment of compression ring 32 of FIG. 3 including fastener 52 and spacer hoop 54. Compression ring 32 comprises split band 48 having opposite distal ends at which tabs 46A and 46B are located, respectively. Split band 48 is bent into an annular or circular shape such that tabs 46A and 46B oppose each other. Tabs 46A and 46B thus comprise upstanding flanges extending radially outward from split band 48. Tabs 46A and 46B include bores 64A and 64B, respectively, into which fastener 52 is inserted. Bore 64A includes collar 66, which includes threads, while bore 64B is provided as an un-threaded bore. Thus, fastener 52 can be threaded into bore 64A to bring tab 46B into engagement with tab 46A, thereby reducing the diameter of split band 48. In the described embodiment, split band 48 is fabricated from a metallic material, such as stainless steel. Split band 48 can, however, be comprised of any suitable material, such as a polymeric material. Split band 48 is sized to have a larger diameter than the cylindrical housing of sensor module 30 when tabs 46A and 46B are spaced apart, and approximately the same diameter as sensor module 30 when tabs 46A and 46B are engaged with divider 56 (FIG. 3). In other embodiments, split band 48 is slightly larger than the diameter of the cylindrical housing of sensor module 30 when tabs 46A and 46B are engaged with divider 56, with spacer hoop 54 taking up the space therebetween.

Spacer hoop 54 comprises an annular or circular shaped ring that is disposed within split band 48. Spacer hoop 54 is split such that ends 64A and 64B are in opposition across a gap G. As such, as fastener 52 brings tabs 46A and 46B together, spacer hoop 54 can flex to vary the width of gap G, thereby changing the diameter of spacer hoop 54. Spacer hoop 54 can thus be fit around sensor modules of different size. Furthermore, in various configurations, spacer hoop 54 can be resiliently biased either around sensor module 30 (FIG. 2) or within split band 48 to facilitate assembly. Spacer hoop 54 is configured to take up space between the inner diameter of module compartment 38 and the outer diameter of sensor module 30. In one configuration, spacer hoop 54 includes smooth surfaces that mate flush with split band 48 and sensor module 30. Split band 48 thereby applies a dispersed compressive force around sensor module 30. In the described embodiment, spacer hoop 54 is fabricated from a polymeric material. Spacer hoop 54 can, however, be comprised of any suitable material, such as a metallic material.

FIG. 5 is a bottom rear perspective view of transmitter housing 28 of FIG. 2 with sensor module 30 removed to show compression ring 32 and spacer hoop 54. Transmitter housing 28 includes electronics compartment 34, which encloses internal space 68, and module compartment 38, which encloses internal space 70. Electronics compartment 34 includes opening 73, which permits internal space 68 to communicate with internal space 70. As such, when sensor module 30 (FIG. 2) is inserted into module compartment 38, wiring 88 (FIG. 8) from a sensor can connect with electronics positioned in electronics compartment 34. Module compartment 38 includes threads 72 that are configured to receive mating threads 90 (FIG. 8) on sensor module 30.

Module compartment 38 also includes rim 60, which includes window 50. Compression ring 32 is disposed adjacent rim 60 within module compartment 38. Tabs 46A and 46B extend radially outward from split band 48 to extend through window 50. Divider 56 is positioned between tabs 46A and 46B. Spacer hoop 54 is positioned inside of split band 48. In one embodiment, split band 48 is resiliently biased to expand radially outward against module compartment 38 to facilitate assembly. In one embodiment, spacer hoop 54 is resiliently biased radially outward against split band 48. Spacer hoop 54 can be sized to bring the inner diameter of split band 48 when positioned within rim 60 of module compartment 38 into engagement with the outer diameter of sensor module 30.

The material of spacer hoop 54 can be selected to eliminate or reduce material-to-material interaction between sensor module 30 and housing 28. For example, in some embodiments, sensor module 30 may be comprised of stainless steel, while housing 28 is comprised of aluminum or an aluminum alloy. These types of materials can, over time, interact with each other to degrade the integrity of the materials, especially if exposed to corrosive conditions. Thus, spacer hoop 54 can be comprised of a plastic or polymer material that provides a buffer between metallic surfaces of sensor module 30 and housing 28. In other embodiments, however, spacer hoop 54 can be metallic, such as aluminum or stainless steel.

Figure 6:
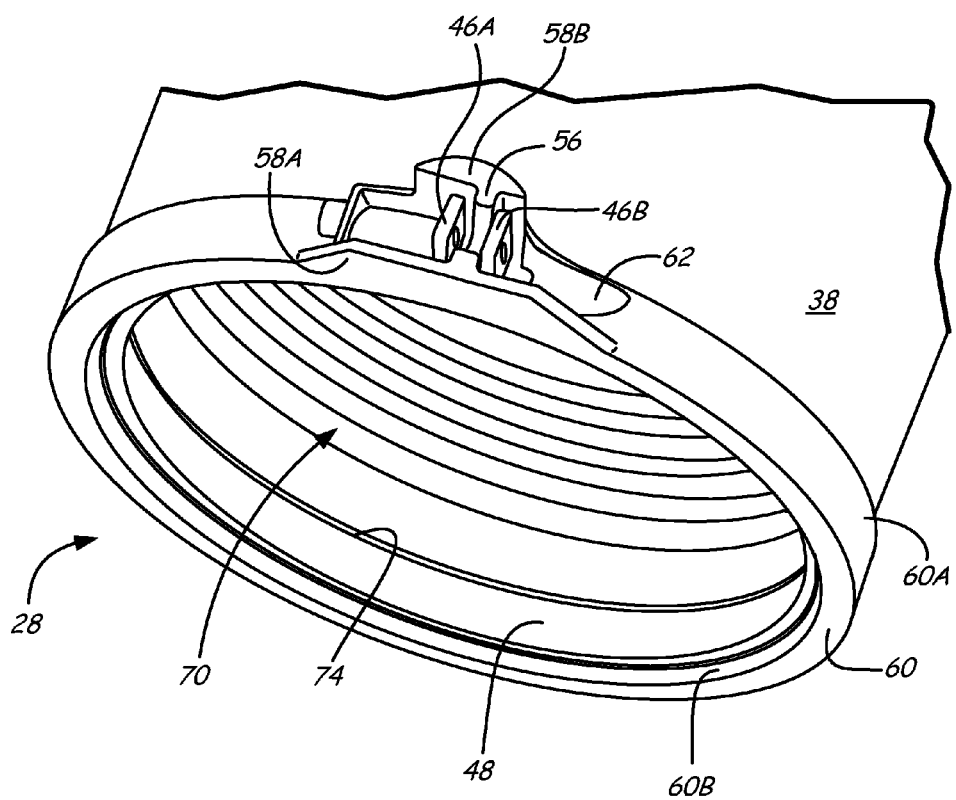
FIG. 6 is a bottom front perspective view of the electronics housing of FIG. 2 with the sensor module removed showing the tabs of the internal compression ring extending through the window in the housing.

FIG. 6 is a bottom front perspective view of transmitter housing 28 of FIG. 2 with sensor module 30 removed showing tabs 46A and 46B of split band 48 extending through window 50 in module compartment 38. Rim 60 surrounds an edge of module compartment 38 that provides an entry into internal space 70. Outer surface 60A of rim 60 is arcuate except for window 50 and indentation 62. Shields 58A and 58B bracket window 50. Divider 56 extends from shield 58A to shield 58B across window 50. Inner surface 60B of rim 60 includes channel 74 in which split band 48 is positioned. Window 50 extends into outer surface 60A of rim 60 and through to channel 74. Channel 74 provides a shelf on which split band 48 can rest when housing 28 is disassembled from sensor module 30 (FIG. 2). Thus, channel 74 inhibits the ability of split band 48 to dislodge from transmitter compartment 38. In the embodiment shown, channel 74 is approximately as deep as split band 48 is thick. Thus, split band 48 is approximately flush with inner surface 60B of rim 60. However, channel 74 can be deeper or shallower than the thickness of split band 48 in other embodiments. As shown in FIG. 5, spacer hoop 54 is positioned adjacent split band 48 to accommodate joining sensor module 30 to housing 28. Tabs 46A and 46B of split band 48 are cinched together via fastener 52 to close down on divider 56.

Figure 7:
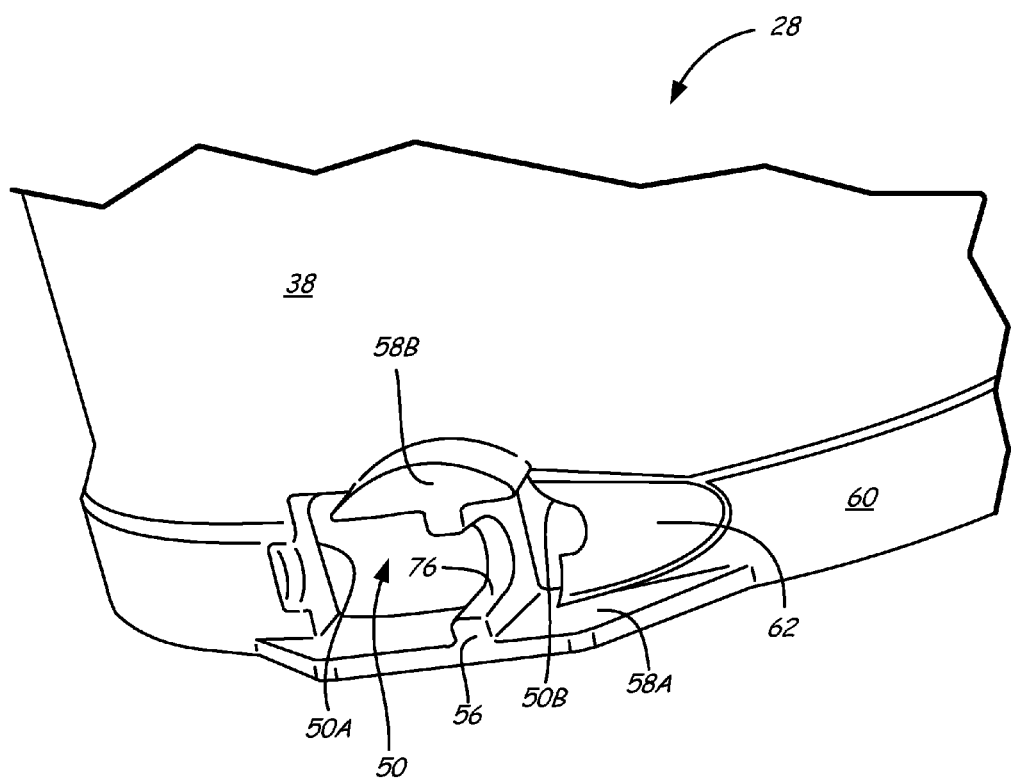
FIG. 7 is a front perspective view of the transmitter housing of FIG. 2 showing the window without the internal compression ring.

FIG. 7 is a partial perspective view of transmitter housing 28 showing window 50 without compression ring 32. Module compartment 38 of transmitter housing 28 includes rim 60 through which window 50 extends. Divider 56 extends to partition window 50 into window portion 50A and window portion 50B. Indentation 62 partially blends module compartment 38 and rim 60 to provide accessibility to divider 56. Divider 56 includes passage 76 to permit a fastener, such as fastener 52 of FIG. 3, to extend through divider 56. Window portion 50B is narrow compared to window portion 50A. In one embodiment, window portion 50B is sized slightly larger than tab 46B (FIG. 3) such that when tab 46B of split band 48 extends through window portion 50B it is substantially immobilized. Window portion 50A is sized to be wider than tab 46A (FIG. 3). As such, tab 46A can translate within window portion 50A and compression ring 32 is permitted to expand to a larger diameter via the resiliency of split band 48, but can be closed down by fastener 52 to bring tabs 46A and 46B into contact with divider 56.

Shields 58A and 58B provide strengthening to module compartment 38 adjacent window 50. Shield 58A provides strengthening of the edge of rim 60 adjacent window 50. Shield 58A also assists channel 74 (FIG. 6) in retaining compression ring 32. Shield 58B strengthens rim 60 and is shaped to mimic the appearance of a pad in which a set screw is located in conventional transmitters. As such, shield 58B has an arcuate outer surface that resembles the circular appearance of a collar into which a set screw is threaded. Shields 58A and 58B also provide surface area for joining divider 56 to module compartment 38. The width of divider 76 can be increased to the width of shields 58A and 58B to provide more area for engaging tabs 46A and 46B, while having sufficient space available for accommodating passage 76 for fastener 52 (FIG. 4). In other embodiments of the invention, divider 56 and shields 58A and 58B may be omitted from housing 28 such as, for example, to accommodate other types of compression rings.

Although described with reference to spacer hoop 54 in FIGS. 2-6, any type of spacer can be provided between split band 48 and sensor module 30. For example, shims or intermittent arcuate pad segments can be positioned on either split band 48 or sensor module 30. Such shims or segments can be affixed, such as with an adhesive or the like, to either sensor module 30 or module compartment 38. However, a complete or nearly complete hoop provides better transfer of compressive forces from split band 48 to the entire circumference of sensor module 30 and thereby better distributes compressive loading. In other embodiments, spacer hoop 54 mat be omitted such that split band 48 contacts module 30 directly.

Figure 8:
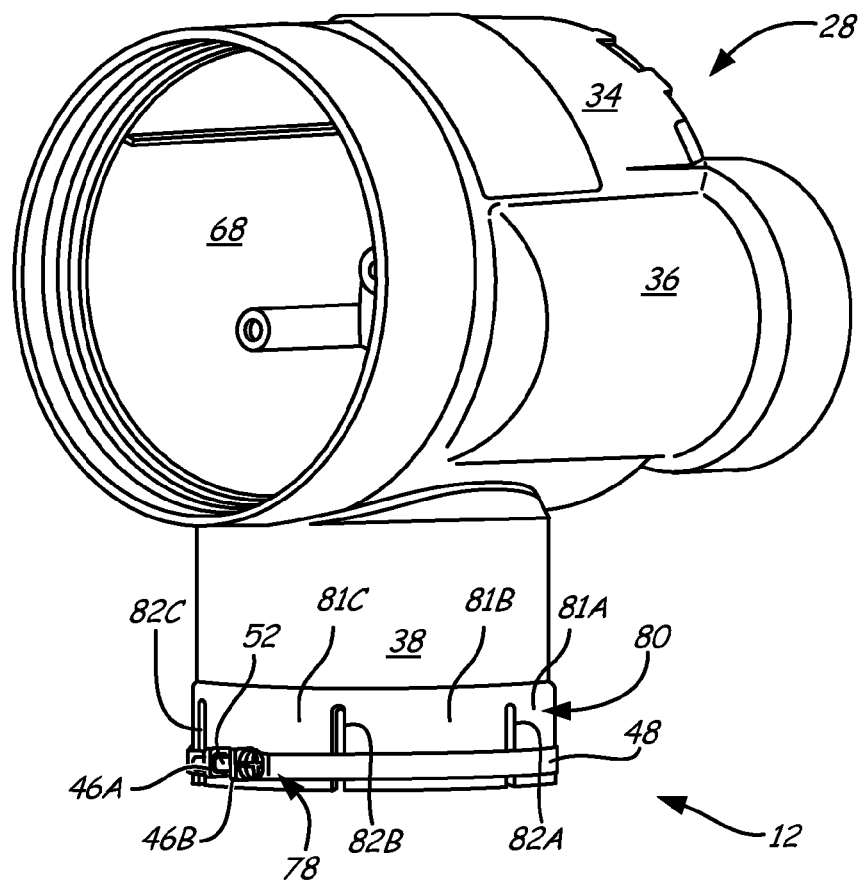
FIG. 8 is a perspective view of an industrial process transmitter having an alternative embodiment of the reduced-stress coupling of the present invention comprising an external compression ring.
Figure 8:
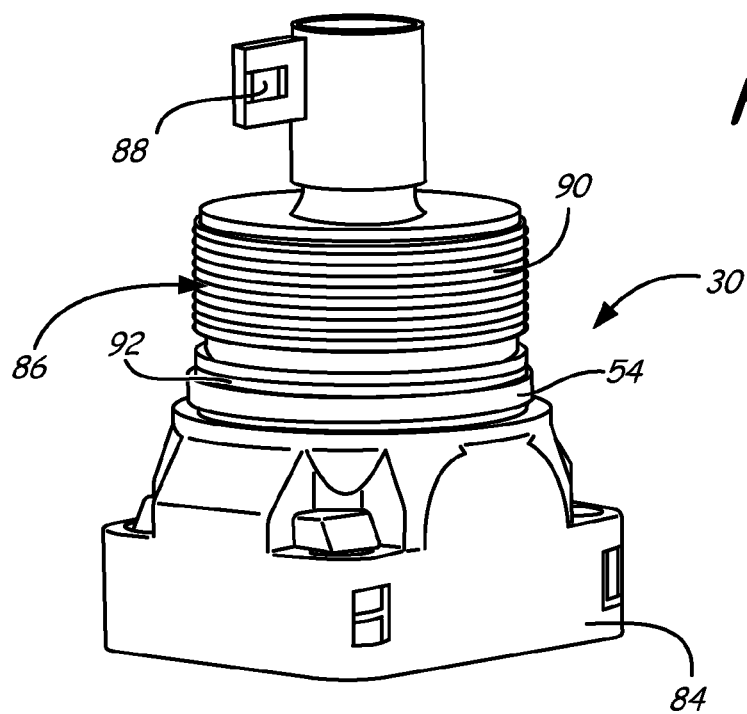

FIG. 8 is perspective view of industrial process transmitter 12 having an alternative embodiment of the reduced-stress coupling of the present invention comprising external compression ring 78. In the embodiment shown, external compression ring 78 is the same as internal compression ring 32 of FIGS. 1-7. However, split band 48 is mounted outside of rim 80 of module compartment 38. In the embodiment of FIG. 8, rim 80 includes slits 82A, 82B and 82C that increase flexibility of rim 80. Slits 82A-82C result in rim 80 being divided into flanges 81A, 81B and 81C. Rim 80 does not include a window such as window 50 of FIGS. 1-7. Other components of transmitter housing 28 shown in FIG. 8 that are the same as shown in FIGS. 1-7 include like reference numerals.

External compression ring 78 couples transmitter housing 28 to sensor module 30. Sensor module 30 includes flange 84, sensor housing 86 and wiring 88. Flange 84 includes means for interfacing with a process fluid, such as isolation diaphragms. A hydraulic fluid communication system relays a process condition, such as pressure, to a sensor disposed within sensor housing 86. Sensor housing 86 is inserted into module compartment 38 within transmitter housing 28. Sensor housing 86 includes threads 90 which interface with threads 72 (FIG. 5) within module compartment 38. Wiring 88 extends through opening 73 (FIG. 5) in electronics compartment 34 to join to electronics disposed within internal space 68 of electronics compartment 34. In the described embodiment, sensor housing 86 and module compartment 38 comprise cylindrical bodies that have co-axial centers when assembled.

To assemble sensor module 30 to transmitter housing 28, spacer hoop 54 is positioned around the outside of spacer seat 92 of sensor housing 86, and split band 48 is positioned around the outside of rim 80. Specifically, fastener 52 on external band 78 is loosened to allow split band 48 to be positioned around rim 80. Next, module compartment 38 is positioned over sensor housing 86 until rim 80 is adjacent spacer seat 92. Specifically, transmitter housing 28 is rotated to thread module compartment 38 onto threads 90 of sensor housing 86. Fastener 52 is then tightened so that tabs 46A and 46B are drawn together and the diameter of split band 48 is reduced. As such, split band 48 applies a compressive force around rim 80. Slits 82A-82C, as well as other slits not shown that are distributed around rim 80, are deflected slightly toward sensor housing 86. Flanges 81A-81C thereby apply compressive force from split band 48 to spacer hoop 54 (FIG. 4) within module compartment 38. The spacer hoop then transfers the compressive force to sensor housing 86. The compressive forces inhibit transmitter housing 28 from moving relative to sensor module 30. More particularly, module compartment 38 is prevented from circumferentially rotating with reference to sensor housing 86. The compressive forces prevent axial displacement of module compartment 38 relative to sensor housing 86, however engagement of threads 90 with threads 72 (FIG. 5) inside module compartment 38 bear much of the axial loading.

Figure 9A:
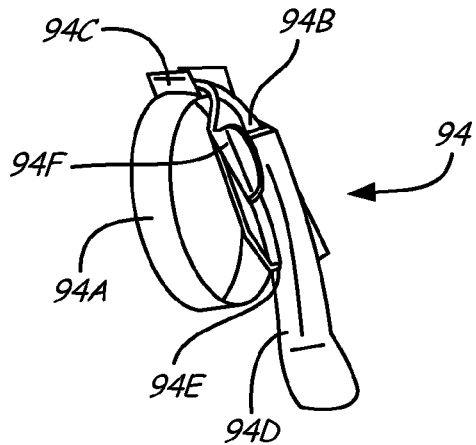
FIGS. 9A-9C show various embodiments of compression rings that can be used in the reduced-stress coupling of the present invention, including a draw latch, a hose clamp and a spring clamp.

FIG. 9A shows an embodiment of the reduced-stress coupling of the present invention in which the compression ring comprises draw latch 94. Draw latch 94 is of conventional design and includes split band 94A having ends that are connected by latch 94B. Latch 94B is rotatably anchored to split band 94A at pivot 94C and rotatably connected to lever 94D at pivot 94E. Lever 94D is rotatably anchored to split band 94A at pivot 94F. As such, lever 94D can be rotated at pivot 94F to increase the distance between pivots 94C and 94E. The diameter of split band 94A is thereby decreased, causing the application of a compressive force to either sensor module 30 (FIGS. 3A and 3B) or rim 80 (FIG. 8) when positioned inside split band 94A.

Figure 9B:
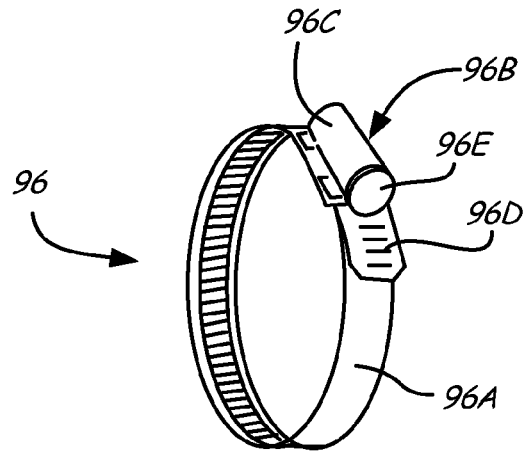

FIG. 9B shows an embodiment of the reduced-stress coupling of the present invention in which the compression ring comprises hose clamp 96. Hose clamp 96 is of conventional design and includes split band 96A having ends that are connected by worm gear 96B. One end of split band 96A is connected to threaded sleeve 96C while a second end of split band 96B includes slots 96D. Fastener 96E is rotated within threaded sleeve 96C such that threads on fastener 96E push and pull slots 96D, thereby adjusting the diameter of hose clamp 96. Thus, hose clamp 96 can be used to apply a compressive force to either sensor module 30 (FIGS. 3A and 3B) or rim 80 (FIG. 8) when positioned inside split band 96A.

Figure 9C:
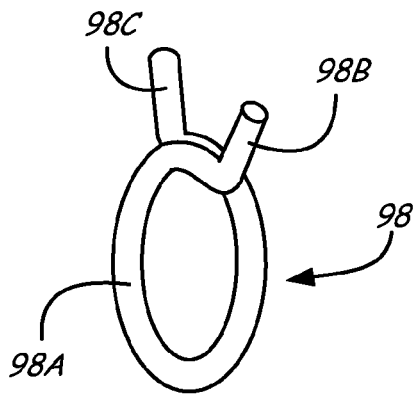

FIG. 9C shows an embodiment of the reduced-stress coupling of the present invention in which the compression ring comprises spring clamp 98. Spring clamp 98 is of conventional design and includes split band 98A having upstanding ends 98B and 98C. Split band 98A is wound into a coil, the diameter of which can be expanded by pushing upstanding ends 98B and 98C toward each other. The resilient force of split ring 98A being wound into a coil causes split ring 98A to return to the smaller diameter when upstanding ends 98B and 98C are released, thus causing a compressive force to either sensor module 30 (FIGS. 3A and 3B) or rim 80 (FIG. 8) when positioned inside split band 98A.

Draw latch 94, hose clamp 96 and spring clamp 98 can be used in a reduced-stress coupling that is either internal or external to transmitter housing 28. In an external-mounted embodiment, draw latch 94, hose clamp 96 or spring clamp 98 is positioned around flanges 81 of rim 80, as shown in FIG. 8. As with external compression ring 78 (FIG. 8), draw latch 94, hose clamp 96 and spring clamp 98 apply compressive force to flanges 81 to prevent relative movement, particularly rotational movement, between transmitter housing 28 and sensor module 30 (FIG. 8). In an internal-mounted embodiment, draw latch 94, hose clamp 96 or spring clamp 98 is positioned around spacer hoop 54 and spacer seat 92 of sensor module 30, as shown in FIG. 8. Housing 28 is positioned over the compression ring such that a component of the compression ring extends through window 50 to limit rotation of housing 28. For example, lever 94D, sleeve 96C or upstanding ends 98A and 98B can extend through window 50 to form a fixed locator that prevents module compartment 38 from rotating about sensor module 30. In such an embodiment, window 50 in rim 60 need not include divider 56 to accommodate penetration of draw latch 94, hose clamp 96 or spring clamp 98 through rim 60. In yet other embodiments, shield 58A may also be omitted from window 50 to accommodate insertion of sensor module 30 into module compartment 38. However, window 50 may be configured with other specific anti-rotation features protruding from window 50 to permit draw latch 94, hose clamp 96 or spring clamp 98 through the window, but that engage draw latch 94, hose clamp 96 or spring clamp 98 to restrict rotational movement.

The present invention provides a reduced-stress coupling for joining a process transmitter housing with a sensor module in an industrial process transmitter. The reduced-stress coupling includes a ring, band or hoop that applies a compressive loading to either the sensor module or process transmitter housing. The compressive loading can directly resist relative rotation between the housing and module by compressing the transmitter housing against the module. The compressive loading can also indirectly resist relative rotation between the housing and module by providing a fixed locator extending from the module that arrests rotation of the housing. The locator can further be configured to attach to an anti-rotation feature of the process transmitter housing to fix the location of the housing relative to the module. The compressive loading is applied around nearly the entire circumference of the sensor module such that stress concentrations are avoided. As such, the reduced-stress coupling of the present invention is particularly well-suited for use in process transmitter housings fabricated of polymeric materials or other materials that are permeable by wireless network signals used by industrial process transmitters.

Although the present invention has been described with reference to preferred embodiments, workers skilled in the art will recognize that changes may be made in form and detail without departing from the spirit and scope of the invention.

The invention claimed is:

1. An industrial process transmitter comprising:
    a sensor module in which a process sensor is located;
    a housing comprising:
        an electronics compartment having an internal space in which transmitter electronics are located; and
        a sensor compartment having an opening into which the sensor module is positioned; and
    a compression ring internal to the housing that applies a compressive force on the sensor module, wherein the compressive force arrests relative rotation of the housing and the sensor module.

2. The industrial process transmitter of claim 1 wherein the compression ring includes a fixed locator that inhibits rotation of the housing.

3. The industrial process transmitter of claim 2 wherein the housing includes an anti-rotation features engaged with the fixed locator.

4. The industrial process transmitter of claim 1 wherein the housing is fabricated from a polymeric material.

5. The industrial process transmitter of claim 1 wherein the compressing ring comprises:
    a split band having a pair of opposing upstanding flanges; and
    a fastener joining the upstanding flanges.

6. The industrial process transmitter of claim 5 wherein:
    the split band is positioned around the sensor module; and
    the sensor compartment further comprises a window through which the upstanding flanges extend.

7. The industrial process transmitter of claim 6 wherein the window further comprises:
    a partition that divides the window into first and second portions that each receive one of the upstanding tabs; and
    a passage in the partition through which the fastener extends.

8. The industrial process transmitter of claim 6 wherein the housing further comprises:
    a channel circumscribing an inside of the opening;
    wherein the split band is positioned within the channel.

9. The industrial process transmitter of claim 1 wherein the compression ring is selected from the group consisting of: a draw latch, a hose clamp and a spring clamp.

10. The industrial process transmitter of claim 1 wherein the housing includes a cylindrical body forming the sensor compartment.

11. The industrial process transmitter of claim 10 wherein the cylindrical body includes a slit and the compression ring is positioned over the cylindrical body and across the slit.

12. The industrial process transmitter of claim 1 and further comprising:
    a spacer hoop positioned between the sensor module and the sensor compartment so as to be disposed concentrically within the compression ring.

13. An industrial process transmitter comprising:
    a sensor module including a sensor and a sensor housing, the sensor housing including external threads, and a spacer hoop positioned around a spacer seat located below the external threads, the spacer hoop having a gap;
    transmitter electronics in electric communication with the sensor;
    a housing comprising:
        an internal compartment in which the transmitter electronics are positioned; and
        a module compartment into which the sensor module is inserted, the module compartment including internal threads that mate with the external threads of the sensor module to make a threaded rotatable connection between the sensor module and the module compartment, and including a flexible rim below the internal threads; and
    a compression ring clamped onto the flexible rim to prevent rotation of the housing with respect to the sensor module by applying compressive force through the flexible rim to the spacer hoop, which transfers the compressive force to the sensor module to inhibit the housing from moving relative to the sensor module.

14. The industrial process transmitter of claim 13 wherein the flexible rim comprises:
    a plurality of flanges separated by a plurality of slits in the housing.

15. The industrial process transmitter of claim 13 wherein the compression ring is selected from the group consisting of: a split ring with a threaded fastener, a split ring with a draw latch, a hose clamp and a spring clamp.

16. An industrial process transmitter comprising:
    a sensor module in which a process sensor is located;
    a housing comprising:
        an electronics compartment having an internal space in which transmitter electronics are located; and
        a sensor compartment having an opening into which the sensor module is positioned;
    a compression ring that applies a compressive force that arrests relative rotation of the housing and the sensor module, the compression ring comprising:
        a split band having a pair of opposing upstanding flanges, wherein the split band is positioned around the sensor module; and
        a fastener joining the upstanding flanges; and
    wherein the sensor compartment further comprises a window through which the upstanding flanges extend.

17. The industrial process transmitter of claim 16 wherein the compression ring includes a fixed locator that inhibits rotation of the housing.

18. The industrial process transmitter of claim 17 wherein the housing includes an anti-rotation features engaged with the fixed locator.

19. The industrial process transmitter of claim 16 wherein the housing is fabricated from a polymeric material.

20. The industrial process transmitter of claim 16 wherein the window further comprises:
    a partition that divides the window into first and second portions that each receive one of the upstanding tabs; and
    a passage in the partition through which the fastener extends.

21. The industrial process transmitter of claim 16 wherein the housing further comprises:
   a channel circumscribing an inside of the opening;
   wherein the split band is positioned within the channel.

22. The industrial process transmitter of claim 16 wherein the housing includes a cylindrical body forming the sensor compartment.

23. The industrial process transmitter of claim 22 wherein the cylindrical body includes a slit and the compression ring is positioned over the cylindrical body and across the slit.

24. The industrial process transmitter of claim 16 and further comprising:
   a spacer hoop positioned between the sensor module and the sensor compartment so as to be disposed concentrically within the compression ring.

* * * * *